United States Patent
Choi et al.

(10) Patent No.: US 11,161,323 B2
(45) Date of Patent: Nov. 2, 2021

(54) WINDOW SUBSTRATE AND FLEXIBLE DISPLAY DEVICE INCLUDING THE SAME

(71) Applicant: SAMSUNG DISPLAY CO., LTD., Yongin-si (KR)

(72) Inventors: Minhoon Choi, Seoul (KR); Sanghoon Kim, Hwaseong-si (KR); Seongjin Hwang, Suwon-si (KR); Dohoon Kim, Suwon-si (KR); Sangil Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 49 days.

(21) Appl. No.: 16/576,913

(22) Filed: Sep. 20, 2019

(65) Prior Publication Data
US 2020/0133342 A1 Apr. 30, 2020

(30) Foreign Application Priority Data
Oct. 29, 2018 (KR) .................. 10-2018-0130050

(51) Int. Cl.
| H05K 1/03 | (2006.01) |
|---|---|
| H05K 1/05 | (2006.01) |
| H05K 1/18 | (2006.01) |
| H01L 51/00 | (2006.01) |
| H01L 51/52 | (2006.01) |
| B32B 17/08 | (2006.01) |
| B32B 17/10 | (2006.01) |

(Continued)

(52) U.S. Cl.
CPC ............... *B32B 7/12* (2013.01); *B32B 27/08* (2013.01); *G02F 1/133305* (2013.01); *G06F 1/1652* (2013.01); *H01L 51/0097* (2013.01); *B32B 2307/546* (2013.01); *G06F 2203/04102* (2013.01); *H01L 2251/5338* (2013.01)

(58) Field of Classification Search
CPC .......... H05K 1/03; H05K 1/05; H05K 1/0393; H05K 1/056; H05K 1/18; H05K 1/189; H01L 51/00; H01L 51/003; H01L 51/0097; H01L 51/52; H01L 51/5253; B32B 17/08; B32B 17/10; G02F 1/1335; G02F 1/1368; G02F 1/1637; G02F 1/13338; G02F 1/13363; G02F 1/133305; G02F 1/133512; G02F 1/136209; G06F 1/1637; G06F 1/1652
USPC ........ 361/749, 713, 767, 782; 438/124, 455, 438/458, 613; 349/12, 96
See application file for complete search history.

(56) References Cited

U.S. PATENT DOCUMENTS

2011/0089429 A1* 4/2011 Prabhakar ........... H01L 31/1872
257/75
2011/0101364 A1* 5/2011 Prabhakar ........... H01L 21/0245
257/66
(Continued)

FOREIGN PATENT DOCUMENTS

| KR | 1020150078001 A | 7/2015 |
|---|---|---|
| KR | 1020150085352 A | 7/2015 |

(Continued)

*Primary Examiner* — Xiaoliang Chen
(74) *Attorney, Agent, or Firm* — Cantor Colburn LLP (57) ABSTRACT

A window substrate includes a glass substrate, a first bonding layer disposed on a first surface of the glass substrate, and a first stress relief layer disposed between the bonding layer and the glass substrate. The first bonding layer has a thickness greater than a thickness of the glass substrate.

12 Claims, 9 Drawing Sheets

(51) Int. Cl.

| | |
|---|---|
| *G02F 1/1335* | (2006.01) |
| *G02F 1/1368* | (2006.01) |
| *G02F 1/13363* | (2006.01) |
| *B32B 7/12* | (2006.01) |
| *G06F 1/16* | (2006.01) |
| *G02F 1/1333* | (2006.01) |
| *B32B 27/08* | (2006.01) |

(56) References Cited

U.S. PATENT DOCUMENTS

| | | | |
|---|---|---|---|
| 2014/0043546 A1* | 2/2014 | Yamazaki | G02F 1/13338 |
| | | | 349/12 |
| 2015/0185782 A1 | 7/2015 | Kim et al. | |
| 2016/0370508 A1* | 12/2016 | Jeong | C09J 7/35 |
| 2017/0168338 A1* | 6/2017 | Bae | H01L 27/3248 |
| 2017/0297309 A1* | 10/2017 | Yoshida | C08L 29/14 |
| 2018/0151829 A1* | 5/2018 | Yoon | H01L 51/0096 |
| 2018/0184519 A1* | 6/2018 | Jia | H01L 51/0097 |
| 2019/0363142 A1* | 11/2019 | Tanaka | H01L 51/003 |

FOREIGN PATENT DOCUMENTS

| | | |
|---|---|---|
| KR | 1020170063433 A | 6/2017 |
| KR | 1020170071672 A | 6/2017 |

* cited by examiner

WINDOW SUBSTRATE AND FLEXIBLE DISPLAY DEVICE INCLUDING THE SAME

This application claims priority to Korean Patent Application No. 10-2018-0130050, filed on Oct. 29, 2018, and all the benefits accruing therefrom under 35 U.S.C. § 119, the content of which in its entirety is herein incorporated by reference.

1. FIELD

Exemplary embodiments of the invention relate to a window substrate and a flexible display device including the window substrate, and more particularly, to a window substrate capable of reducing a folding stress while thinning a thickness of a window glass of a display unit, and to a flexible display device including the window substrate.

2. DISCUSSION OF RELATED ART

As flexible display devices, curved flexible display devices of a first generation and foldable flexible display devices of a second generation are being produced.

In the foldable display, a strain increases as a folding radius of a display panel decreases with regard to a design aspect. To reduce the strain, the foldable display may reduce an overall thickness of the display panel. In the foldable display, an entire thickness of the display panel may be reduced by integrating a plurality of layers such as a polarizing layer and a touch layer.

SUMMARY

Since a display panel of a foldable flexible display device may be easily damaged by an external impact such as a pen drop, it is desired to increase a thickness of an upper portion of the display panel.

In addition, it is also desired to protect a window glass while reducing a folding stress when folding the display panel.

Exemplary embodiments of the invention may be directed to a window substrate capable of reducing a folding stress while thinning a thickness of a window glass of a display unit, and to a flexible display device including the window substrate.

An exemplary embodiment of a window substrate includes a glass substrate, a first bonding layer disposed on a first surface of the glass substrate, and a first stress relief layer disposed between the bonding layer and the glass substrate. The first bonding layer has a thickness greater than a thickness of the glass substrate.

In an exemplary embodiment, the first stress relief layer may include a pressure sensitive adhesive that is foldable.

In an exemplary embodiment, the first stress relief layer may include a material different from a material included in the first bonding layer.

In an exemplary embodiment, the first stress relief layer may have a thickness greater than a thickness of the glass substrate.

In an exemplary embodiment, each of the first stress relief layer and the first bonding layer may have a thickness greater than a thickness of the glass substrate.

In an exemplary embodiment, the first stress relief layer may include a material based on at least one of acrylic, silicon, epoxy and urethane.

In an exemplary embodiment, a modulus of the first stress relief layer may be equal to or greater than about 800 megapascals (MPa).

In an exemplary embodiment, a yield strain of the first stress relief layer may be equal to or greater than about 1.0 percent (%).

In an exemplary embodiment, a thickness of the first stress relief layer may be in a range from about 30 micrometers (μm) to about 50 μm.

In an exemplary embodiment, a thickness of the glass substrate may be in a range from about 10 μm to about 30 μm.

In an exemplary embodiment, the first stress relief layer may include a material of which modulus increases by application of an external force.

In an exemplary embodiment, the modulus of the first stress relief layer may be increased by an external force to a range equal to or greater than about 800 MPa and equal to or less than about 1 gigapascal (GPa).

In an exemplary embodiment, the window substrate may further include a second bonding layer disposed on a second surface of the first bonding layer, and a second stress relief layer disposed between the second bonding layer and the first bonding layer.

An exemplary embodiment of a flexible display device includes a display panel, a window substrate disposed on a first surface of the display panel, and a first adhesive layer disposed between the display panel and the window substrate, and attaching the first surface of the display panel and a surface of the window substrate. The window substrate includes a glass substrate, a bonding layer disposed between the glass substrate and the first adhesive layer, and a stress relief layer disposed between the bonding layer and the glass substrate. The bonding layer has a thickness greater than a thickness of the glass substrate.

In an exemplary embodiment, each of the bonding layer and the stress relief layer may include a material that is foldable and has a property that is transparent and flexible.

In an exemplary embodiment, the stress relief layer may include a material different from a material included in the first adhesive layer.

In an exemplary embodiment, the stress relief layer may have a thickness greater than a thickness of the first adhesive layer.

In an exemplary embodiment, the first adhesive layer may have a thickness less than a thickness of the glass substrate.

In an exemplary embodiment, a modulus of the bonding layer may be equal to or greater than about 800 megapascals (MPa).

In an exemplary embodiment, a yield strain of the bonding layer may be equal to or greater than about 1.0%.

In an exemplary embodiment, a thickness of the glass substrate may be in a range from about 30 μm to about 70 μm.

In an exemplary embodiment, the bonding layer may include a material of which modulus increases by application of an external force.

In an exemplary embodiment, the modulus of the bonding layer may be increased by an external force to a range equal to or greater than about 800 MPa and more and equal to or less than about 1 GPa.

In an exemplary embodiment, the window substrate may further include a protective film disposed on a second surface of the display panel, and a second adhesive layer disposed between the display panel and the protective film and attaching a surface of the protective film to the second surface of the display panel.

An exemplary embodiment of a flexible display device includes a display panel including a wire grid polarizer, a glass substrate disposed on a surface of the display panel, an adhesive layer disposed between the display panel and the glass substrate, and attaching the surface of the display panel and a surface of the glass substrate, a first bonding layer disposed between the glass substrate and the adhesive layer, and a first stress relief layer disposed between the bonding layer and the glass substrate. The bonding layer has a thickness greater than a thickness of the glass substrate.

In an exemplary embodiment, the flexible display device may further include a second bonding layer disposed between the first bonding layer and the adhesive layer, and a second stress relief layer disposed between the second bonding layer and the first bonding layer.

In an exemplary embodiment, the second bonding layer may have a thickness greater than that of the glass substrate.

In an exemplary embodiment, the second stress relief layer may include a pressure-sensitive adhesive that is foldable.

In an exemplary embodiment, the second stress relief layer may include a material different from a material included in the bonding layer.

In an exemplary embodiment, the second stress relief layer may have a thickness greater than a thickness of the adhesive layer.

The foregoing is illustrative only and is not intended to be in any way limiting. In addition to the illustrative exemplary embodiments and features described above, further exemplary embodiments and features will become apparent by reference to the drawings and the following detailed description.

BRIEF DESCRIPTION OF THE DRAWINGS

A more complete appreciation of the invention will become more apparent by describing in detail embodiments thereof with reference to the accompanying drawings, in which.

DETAILED DESCRIPTION

Exemplary embodiments will now be described more fully hereinafter with reference to the accompanying drawings. Although the invention may be modified in various manners and have several embodiments, embodiments are illustrated in the accompanying drawings and will be mainly described in the specification. However, the scope of the present invention is not limited to the exemplary embodiments and should be construed as including all the changes, equivalents and substitutions included in the spirit and scope of the present invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or element and another element or element as illustrated in the drawings. It will be understood that the spatially relative terms are intended to encompass different orientations of the device in use or operation, in addition to the orientation illustrated in the drawings. For example, in a case where a device illustrated in the drawing is turned over, the device disposed "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or elements, but do not preclude the presence or addition of one or more other features, integers, steps, operations, elements, elements, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the specification.

Some of the parts which are not associated with the description may not be provided in order to specifically describe embodiments of the invention and like reference numerals refer to like elements throughout the specification.

Hereinafter, an exemplary embodiment of a flexible display device will be described with reference to FIGS. 1 to 14.

Figure 1:
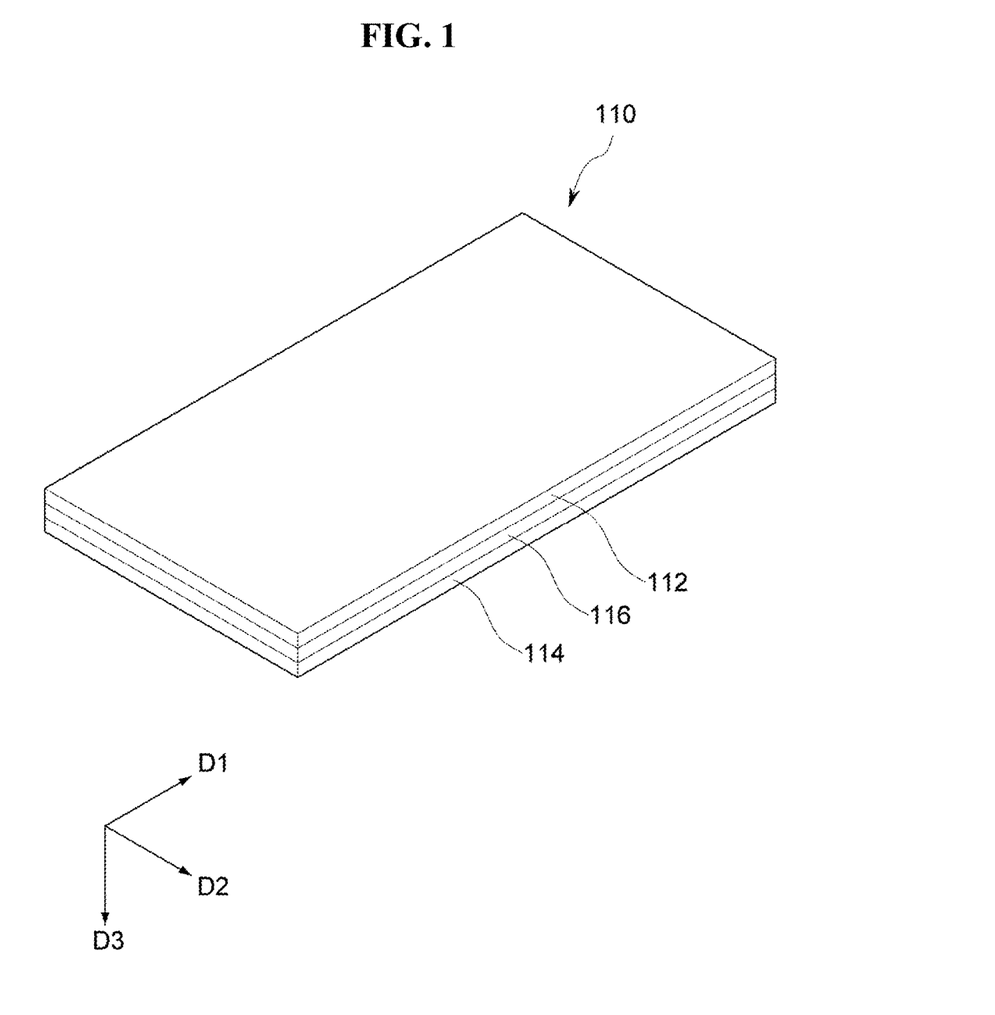
FIG. 1 is a perspective view illustrating an exemplary embodiment of a window substrate.
Figure 2:
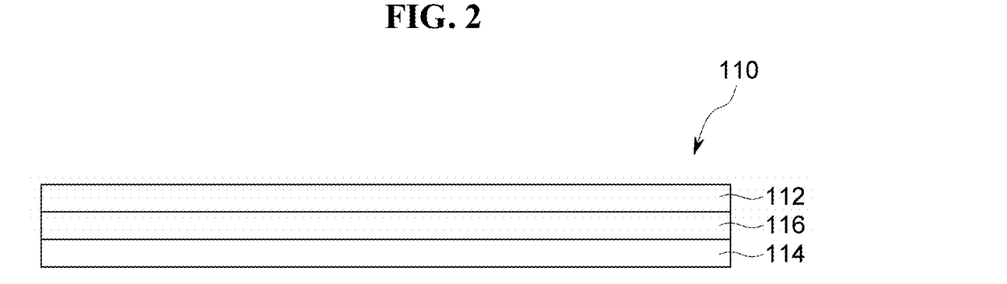
FIG. 2 is a cross-sectional view illustrating a window substrate illustrated in FIG. 1.

FIG. 1 is a perspective view illustrating an exemplary embodiment of a window substrate, and FIG. 2 is a cross-sectional view illustrating a window substrate illustrated in FIG. 1.

Referring to FIGS. 1 and 2, an exemplary embodiment of a window substrate 110 may be provided in the form of a plate.

In an exemplary embodiment, for convenience of description, it is assumed that a shape of the window substrate 110 in a plan view has a quadrangular shape having a pair of long surfaces and a pair of short surfaces. As used herein, an extending direction of a long surface is denoted as a first direction D1, an extending direction of a short surface is denoted as a second direction D2, and a direction perpendicular to the extending direction of the long surface and the short surface is denoted as a third direction D3.

However, the shape of the window substrate 110 is not limited thereto, and the window substrate 110 may have various shapes. In an exemplary embodiment, the window substrate 110 may be provided in a closed polygonal shape including straight sides, for example. In an alternative exemplary embodiment, the window substrate 110 may be provided, for example, in a shape of a circle or an ellipse including a curved surface. In an alternative exemplary embodiment, the window substrate 110 may be provided in various shapes such as semicircular or semi-elliptical shapes including surfaces with straight lines and curved lines.

In an exemplary embodiment, when the window substrate 110 has a straight side, at least a part of vertex portions of each shape may be curved. In an exemplary embodiment, when the window substrate 110 has a quadrangular shape, a portion where the adjacent straight sides meet may be replaced by a curve having a predetermined curvature, for example. That is, the vertex portion of the quadrangular shape may include a curved line which has opposite ends connected to two straight sides adjacent to each other and has a predetermined curvature. In such an exemplary embodiment, the curvature may be set differently depending on the position. In an exemplary embodiment, the curvature may change depending on the position at which the curve starts and the length of the curve, for example.

An exemplary embodiment of the window substrate 110 may include a glass substrate 112, a bonding layer 114, and a stress relief layer 116.

The glass substrate 112 may have a shape corresponding to that of the window substrate 110. In addition, the glass substrate 112 may have a plate shape including opposite surfaces.

The glass substrate 112 may include a glass material that includes silicate. In an exemplary embodiment, the glass substrate 112 may include, for example, aluminosilicate, borosilicate, and boroalumino silicate.

In an exemplary embodiment, in order to improve durability, surface smoothness, and transparency of the glass substrate 112, the glass material may further include various materials. In an exemplary embodiment, the glass substrate 112 may further include, for example, alkali metal, alkaline earth metal, and an oxide thereof.

In an exemplary embodiment, the glass substrate 112 may include, for example, $Al_2O_3$, $Na_2O$, and $SiO_2$. In an exemplary embodiment, the glass substrate 112 may further include, for example, $B_2O_3$, MgO, CaO, BaO, $SnO_2$, $ZrO_2$, $Na_2O$, and SrO. Of the materials included in the glass substrate 112, $Al_2O_3$, $Na_2O$, and $SiO_2$ may be included in various composition ratios. In an exemplary embodiment, the glass substrate 112 may include $Al_2O_3$ in an amount ranging from about 1 mol % to about 10 mol %, $Na_2O$ in an amount equal to or greater than about 10 mol % and equal to or less than about 15 mol %, and $SiO_2$ in an amount ranging from about 65 mol % to about 70 mol %, for example.

An exemplary embodiment of the window substrate 110 is attached to one surface of the display panel 120 by an adhesive layer 130, and protects the display panel 120 from an external impact. In particular, the impact resistance properties of the glass substrate 112 are important for protection from external impact.

In an exemplary embodiment, the glass substrate 112 may include, for example, $Al_2O_3$ and $Na_2O$ in an appropriate ratio to improve impact resistance. In an exemplary embodiment, $Al_2O_3/Na_2O$ included in the glass substrate 112 may be equal to or less than about 1, for example. When $Al_2O_3/Na_2O$ exceeds 1, the impact resistance of the glass substrate 112 is weakened, and the glass substrate 112 may be easily broken at a weak impact.

In an exemplary embodiment, $Al_2O_3/Na_2O$ may be in a range from about 0.2 to about 0.5, for example. In an exemplary embodiment, $Al_2O_3/Na_2O$ may be in a range from about 0.3 to about 0.4, for example.

In an exemplary embodiment, the material included in the glass substrate 112 is not limited to the above-described materials, and may include various other materials and have various ratios. The glass substrate 112 may have a relatively low elastic modulus as compared to other conventional glass substrates.

The glass substrate 112 is disposed on an outermost position of the window substrate 110 and may be directly exposed to the outside. Accordingly, since the glass substrate 112 receives the impact directly from the outside, it is subjected to an impact test such as a ball drop test or a pen drop test.

In an exemplary embodiment, the glass substrate 112 may have flexibility and thus be curved, folded, or rolled. Hereinafter, for the sake of convenience of explanation, it is explained that being bent, folded, and rolled will be comprehensively understood as being folded or bent.

In an exemplary embodiment, a thickness of the glass substrate 112 may be equal to or less than about 100 micrometers (μm). When the thickness of the glass substrate 112 exceeds about 100 μm, it is difficult to bend the window substrate 110 because a repulsive force against deformation is excessively large.

In an exemplary embodiment, the thickness of the glass substrate 112 may be in a range from about 30 μm to about 70 μm, for example. In an alternative exemplary embodiment, the thickness of the glass substrate 112 may be in a range from about 10 μm to about 30 μm, for example.

Generally, when the thickness of the glass substrate is less than about 25 μm, the glass substrate may have a low strength, so that the glass substrate may be broken during the process. However, as an exemplary embodiment of the glass substrate 112 is supported by the bonding layer 114 and the stress relief layer 116 attached to one surface thereof, and the stress is relieved by the stress relief layer 114 at the time of bending, breakage may be substantially prevented. As used herein, the term "being broken" means a state that the glass substrate 112 may not be used according to the intended purpose, e.g., being broken, generation of flaws or cracks, spreading of the flaws or cracks, and fracture.

As the thickness of an exemplary embodiment of the glass substrate 112 is reduced, it is advantageous for bending, and the glass substrate 112 may be manufactured with a thickness less than about 25 μm within a range that the strength and workability are suitably secured. In an exemplary embodiment, the glass substrate 112 may have a thickness in a range from about 10 μm to about 30 μm, for example.

When the glass substrate 112 having such a small thickness receives an impact on an upper surface by an object having a narrow cross-sectional area such as a pen, shock waves may be generated on the glass substrate 112. An area of the glass substrate 112 where the pen contacts by the shock wave is locally deformed and a large stress may be exerted on a rear surface which is an outer surface than the deformed upper surface. The glass substrate 112 may undergo bending breakage due to stress.

However, an exemplary embodiment of the glass substrate 112 may relieve the stress through the use of the stress relief layer 116 and the bonding layer 114 attached to the rear surface, and the shock wave may be reduced or cancelled by the stress relief layer 116 and the bonding layer 114.

The bonding layer 114 is disposed on one surface of the glass substrate 112 and may have a thickness larger than that of the glass substrate 112. The bonding layer 114 may be optically transparent. The meaning of optically transparent means that the light transmittance is equal to or greater than about 80 percent (%). That is, a light transmittance of the bonding layer 114 may be equal to or greater than about 80%, for example.

An exemplary embodiment of the bonding layer 114 may include at least one of an organic material, an organic-inorganic composite material, a metal, and an alloy. In an exemplary embodiment, the organic material may include at least one of polyvinyls resin, polysilolane resin, polymethacrylates resin, polyacrylates resin, polyesters resin, polyether-esters resins, polyurethanes resins, fluorinated polymers, fluorinated copolymers, polystyrenes resins, polycarbonates resins, polysilazane resin, and polyvinylcarbazoles resin, for example.

The stress relief layer 116 may be disposed between the bonding layer 114 and the glass substrate 112.

The stress relief layer 116 may include a pressure sensitive adhesive that is foldable. The stress relief layer 116 may include an optically transparent adhesive or tackifier. The meaning of being optically transparent means that the light transmittance is equal to or greater than about 80%. That is, a light transmittance of the stress relief layer 116 may be equal to or greater than about 80%.

The stress relief layer 116 may have a thickness greater than a thickness of the glass substrate 112. Each of the bonding layer 114 and the stress relief layer 116 may have a thickness greater than that of the glass substrate 112.

The stress relief layer 116 may include a material different from a material included in the bonding layer 114.

A density and an elastic modulus of the stress relief layer 116 may be less than a density and an elastic modulus of the glass substrate 112, respectively. When the density and the elastic modulus of the stress relief layer 116 are less than the density and elastic modulus of the glass substrate 112, respectively, the shock wave may be transmitted from the glass substrate 112 to the stress relief layer 116.

In an exemplary embodiment, the density and modulus of elasticity of the stress relief layer 116 may be less than the density and modulus of elasticity of the bonding layer 114, respectively. Accordingly, the shock wave may be transmitted to the bonding layer 114 through the stress relief layer 116 and may be dissipated to the outside. In addition, since the density and elastic modulus of the adhesive material are generally very low, the shock wave transmitted to the stress relief layer 116 may be relieved inside the stress relief layer 116.

The density of the stress relief layer 116 may be equal to or greater than about 4% of the density of the glass substrate 112, and the elastic modulus of the stress relief layer 116 may be equal to or greater than about 2% of the elastic modulus of the glass substrate 112. When the density of the stress relief layer 116 is equal to or greater than about 4% of the density of the glass substrate 112 and the elastic modulus of the stress relief layer 116 is equal to or greater than about 2% of the elastic modulus of the glass substrate 112, the show wave transmitted to the glass substrate 112 may not be transmitted to the stress relief layer 116 without being reflected at an interface between the glass substrate 112 and the stress relief layer 116. When the shock wave is transmitted from the glass substrate 112 to the stress relief layer 116, the shock wave may be transmitted to the outside of the stress relief layer 116, for example, to the bonding layer 114.

The stress relief layer 116 may include a material based on, for example, at least one of acrylic, silicone, epoxy, and urethane.

The stress relief layer 116 may include at least one of acrylic polymer, ethylene vinyl acetate polymer, nitrile polymer, silicone rubber, butyl rubber, styrene block copolymer block copolymer, vinyl ethers polymer, urethane polymer, and epoxy polymer. In an exemplary embodiment, the stress relief layer 116 may include urethane polymer, for example. In addition, the stress relief layer 116 may include urethane polymer and rubber, or may include urethane polymer and acrylic rubber.

In an exemplary embodiment, a modulus of the stress relief layer 116 may be equal to or greater than about 800 megapascals (MPa), for example.

In an exemplary embodiment, a yield strain of the stress relief layer 116 may be equal to or greater than about 1.0%, for example.

In an exemplary embodiment, a thickness of the stress relief layer 116 may be equal to or greater than about 30 µm and equal to or less than about 50 µm.

The stress relief layer 116 may include a material of which modulus increases by application of an external force.

In an exemplary embodiment, the modulus of the stress relief layer 116 may increase by an external force to a range from about 800 MPa to about 1 gigapascal (GPa), for example.

In an exemplary embodiment, the window substrate 110 may include the stress relief layer 116, thus having impact resistance. In particular, bending deformation of the window substrate 110 due to a point impact may be alleviated.

In an exemplary embodiment, the window substrate 110 may have flexibility and thus may be curved, folded, rolled. That is, a part of an outer surface of the glass substrate 112 on the window substrate 110 may be folded in a direction facing a remaining portion of the outer surface of the glass substrate 112. In an alternative exemplary embodiment, a part of an inner surface of the glass substrate 112 on the window substrate 110 may be folded in a direction facing a remaining portion of the inner surface of the glass substrate 112.

As used herein, the term "being folded" and "being bent" mean being transformed from its original shape to another, not that the shape is fixed, and thus is understood as including concepts of being folded, bent, curved, or rolled.

Figure 3:
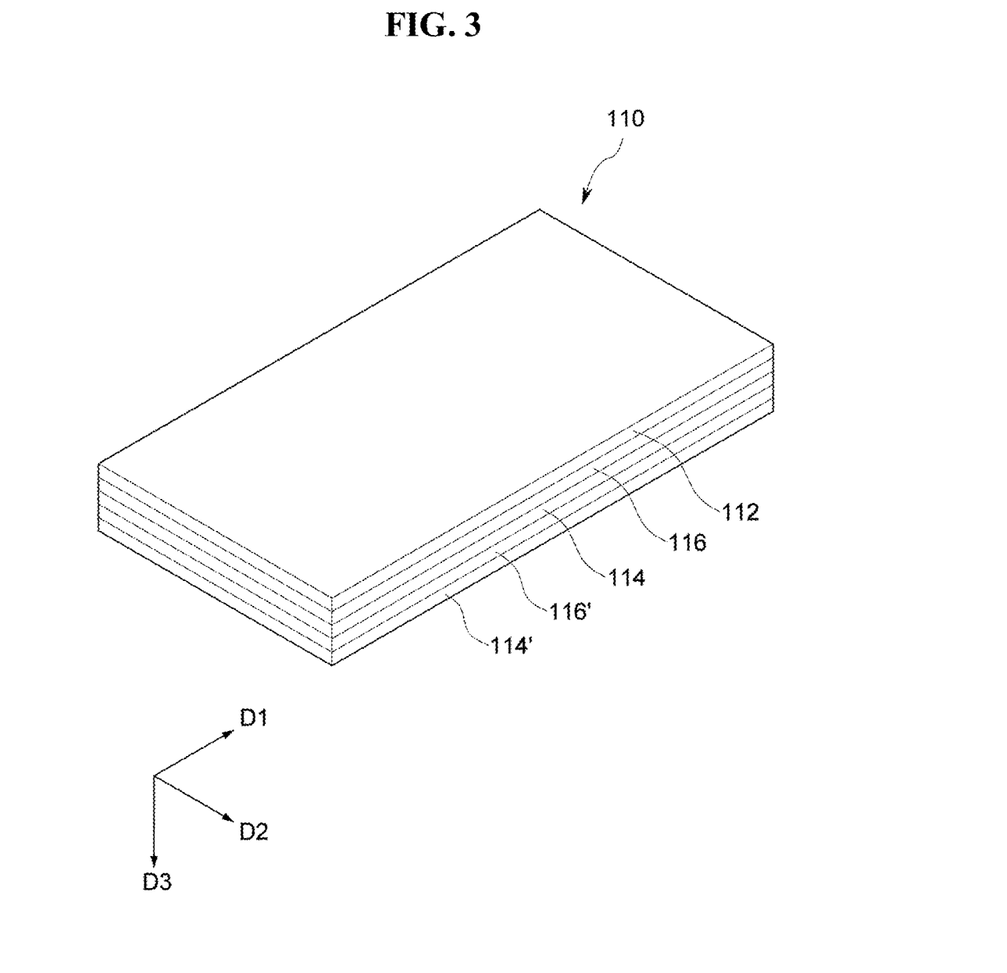
FIG. 3 is a perspective view illustrating another exemplary embodiment of a window substrate including a plurality of bonding layers.
Figure 4:
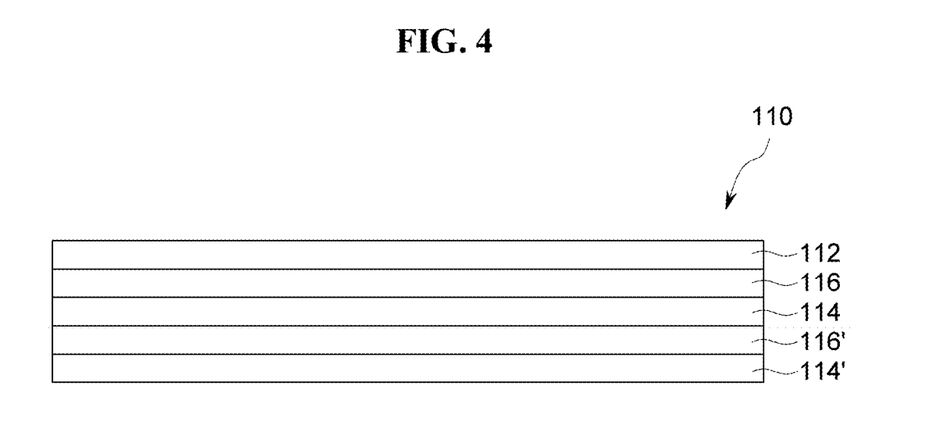
FIG. 4 is a cross-sectional view illustrating a window substrate including a plurality of bonding layers illustrated in FIG. 3.

As illustrated in FIGS. 3 and 4, an exemplary embodiment of the window substrate 110 may include a plurality of bonding layers.

FIG. 3 is a perspective view illustrating another exemplary embodiment of a window substrate including a plurality of bonding layers, and FIG. 4 is a cross-sectional view illustrating a window substrate including a plurality of bonding layers illustrated in FIG. 3.

Referring to FIGS. 3 and 4, another exemplary embodiment of a window substrate 110 includes a glass substrate 112, a first bonding layer 114, a first stress relief layer 116, a second bonding layer 114' and a second stress relief layer 116'.

The glass substrate 112, the first bonding layer 114, and the first stress relief layer 116 are substantially the same in structure and properties as those described in FIGS. 1 and 2.

The second bonding layer 114' is disposed on another surface of the first bonding layer 114 illustrated in FIGS. 1 and 2, and may have substantially the same size, substantially the same thickness, and substantially the same material as those of the first bonding layer 114.

In an alternative exemplary embodiment, the second bonding layer 114' may have different sizes, different thicknesses, and different materials from those of the first bonding layer 114.

The second bonding layer 114' may have a thickness greater than a thickness of the glass substrate 112.

The second stress relief layer 116' may be disposed between the second bonding layer 114' and the first bonding layer 114, and may have substantially the same size, substantially the same thickness, and substantially the same material as those of the first stress relief layer 116 illustrated in FIGS. 1 and 2. In an alternative exemplary embodiment, the second stress relief layer 116' may have different sizes, different thicknesses, and different materials from those of the first stress relief layer 116.

The second stress relief layer 116' may include a pressure sensitive adhesive that is foldable.

The second stress relief layer 116' may have a thickness greater than a thickness of the glass substrate 112, and may include a material different from a material included in the first bonding layer 114.

The second stress relief layer 116' may include a material based on, for example, at least one of acrylic, silicone, epoxy, and urethane.

In an exemplary embodiment, a modulus of the second stress relief layer 116' may be equal to or greater than about 800 MPa, for example.

In an exemplary embodiment, a yield strain of the second stress relief layer 116' may be about 1.0%, for example.

The second stress relief layer 116' may include a material of which modulus increases by application of an external force.

In an exemplary embodiment, the modulus of the second stress relief layer 116' may increase by an external force to a range from about 800 MPa to about 1 GPa, for example.

Figure 5:
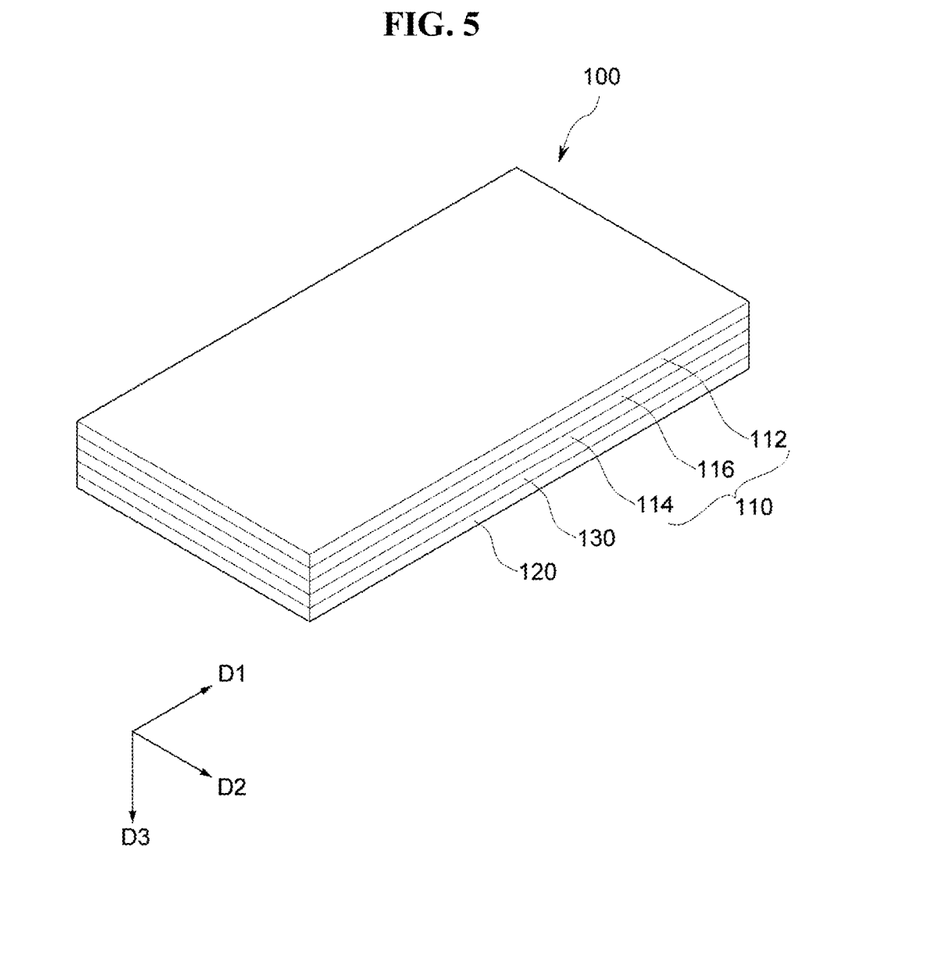
FIG. 5 is a perspective view illustrating another exemplary embodiment of a flexible display device including a window substrate.
Figure 6:
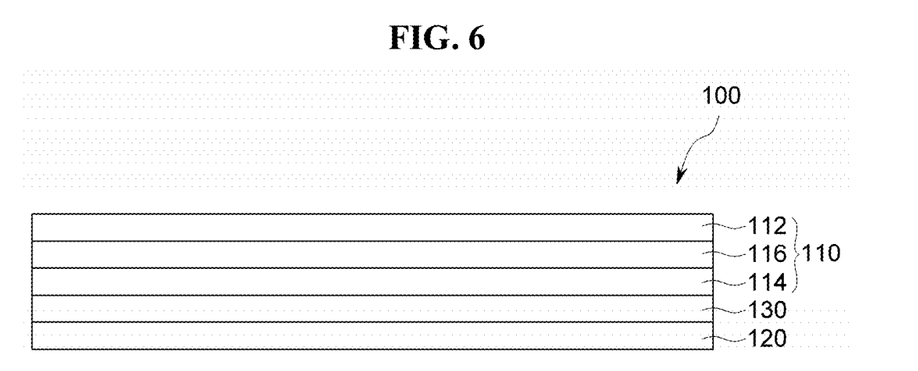
FIG. 6 is a cross-sectional view illustrating the flexible display device illustrated in FIG. 5.

FIG. 5 is a perspective view illustrating another exemplary embodiment of a flexible display device including a window substrate, and FIG. 6 is a cross-sectional view illustrating the flexible display device illustrated in FIG. 5.

Referring to FIGS. 5 and 6, an exemplary embodiment of the flexible display device 100 may include a window substrate 110, a display panel 120, and an adhesive layer 130.

The window substrate 110 may be disposed on the display panel 120. That is, the window substrate 110 may be disposed on one surface of the display panel 120. The window substrate 110 includes a transparent hard material, and may transmit images of the display panel 120 while protecting the display panel 120 from external impact. In addition, the window substrate 110 may include a flexible film material such as a plastic film.

The window substrate 110 includes a transparent material, e.g., glass or resin, and serves to protect the display panel 120 so that the display panel 120 is not broken by an external impact. The window substrate 110 is disposed on, for example, a touch unit, and covers a display area and a pad area. The window substrate 110 is attached to the display panel 120 using the adhesive layer 130 which includes an adhesive resin. The window substrate 110 may be larger than the display panel 120, but the invention is not limited thereto. The window substrate 110 may have a size substantially the same as a size of the display panel 120.

The display panel 120 may include, for example, a flexible film such as a plastic film, and may be implemented by disposing a pixel circuit, e.g., an organic light emitting diode ("OLED"), on a flexible film.

The adhesive layer 130 may be disposed between the display panel 120 and the window substrate 110, and may attach one surface of the display panel 120 to one surface of the window substrate 110.

The window substrate 110 may include a glass substrate 112, a bonding layer 114, and a stress relief layer 116.

The bonding layer 114 is disposed between the glass substrate 112 and the adhesive layer 130, and may have a thickness greater than that of the glass substrate 112.

The stress relief layer 116 may be disposed between the bonding layer 114 and the glass substrate 112.

Each of the bonding layer 114 and the stress relief layer 116 may include a material that is foldable and has a property that is transparent and flexible.

The stress relief layer 116 may include a material different from that included in the adhesive layer 130.

The stress relief layer 116 may have a thickness greater than a thickness of the adhesive layer 130.

The adhesive layer 130 may have a thickness less than that of the glass substrate 112.

In an exemplary embodiment, a modulus of the bonding layer 114 is equal to or greater than about 800 MPa, and a yield strain of the bonding layer 114 may be equal to or greater than about 1.0%.

In an exemplary embodiment, a thickness of the glass substrate 112 may be in a range from about 30 μm to about 70 for example.

The bonding layer 114 may include a material of which modulus increases by application of an external force, and the modulus of the bonding layer 114 may increase by an external force to a range from about 800 MPa to about 1 GPa, for example.

Figure 7:
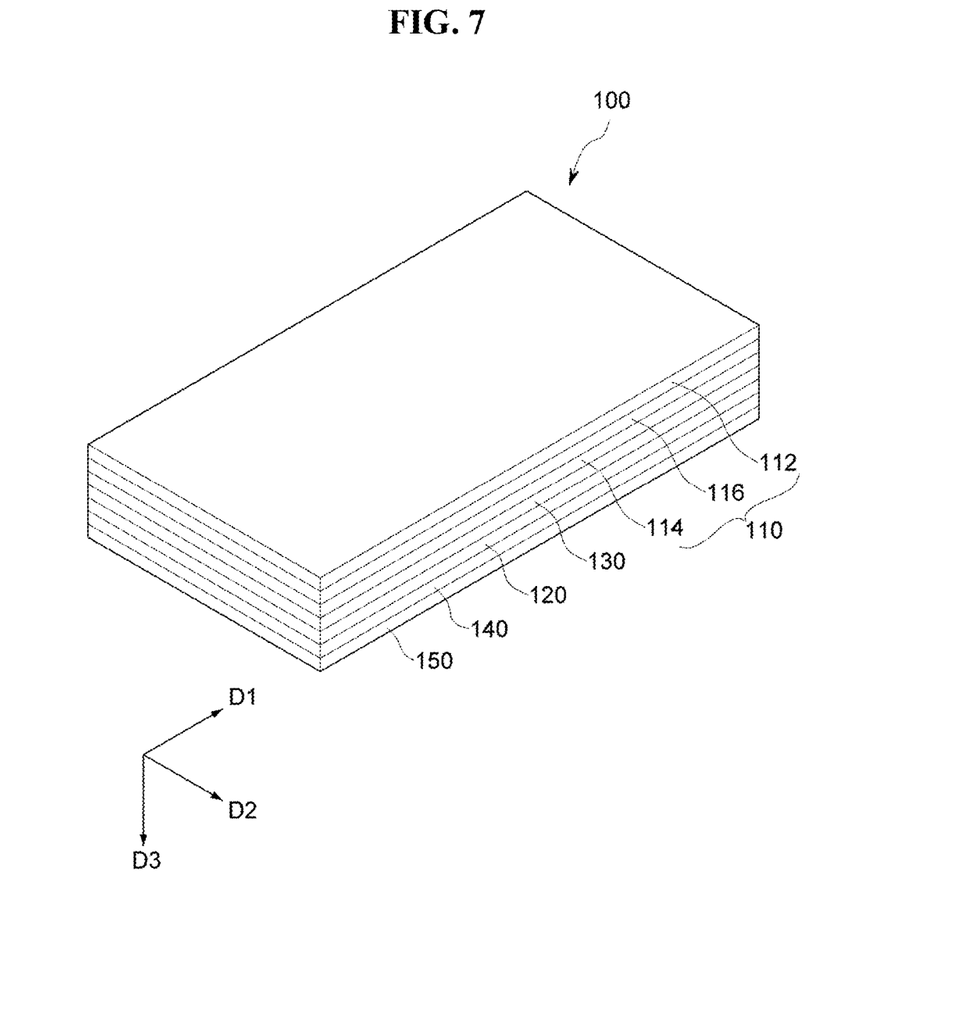
FIG. 7 is a perspective view illustrating an exemplary embodiment of a lower structure of a display panel including a window substrate.
Figure 8:
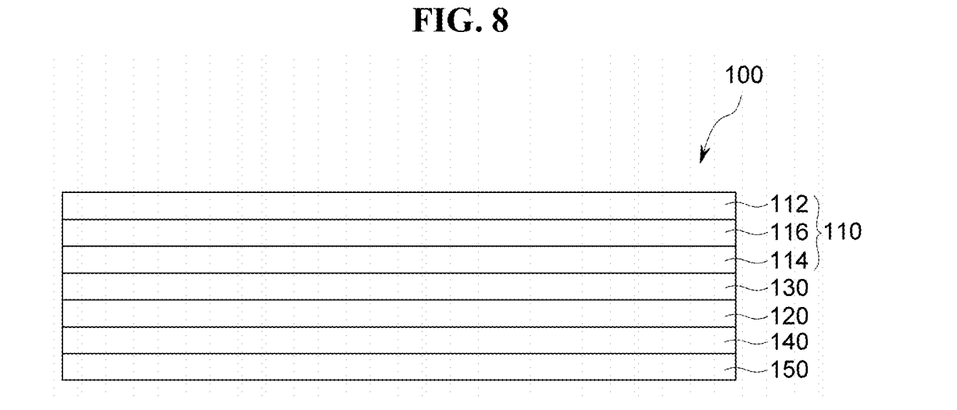
FIG. 8 is a cross-sectional view illustrating a bottom structure of the display panel including the window substrate illustrated in FIG. 7.

Although not illustrated in FIGS. 7 and 8, the window substrate 110 may further include a coating layer disposed on another surface of the glass substrate 112, and a cover layer disposed on the coating layer.

The coating layer is disposed on another surface of the glass substrate 112 and may strengthen a surface of the glass substrate 112. A density and an elastic modulus of the coating layer may be greater than a density and an elastic modulus of the glass substrate 112, respectively.

The cover layer may be an antireflection layer that substantially minimizes reflection of a surface of the glass substrate 112. In addition, the cover layer may be an anti-contamination layer for substantially preventing contamination such as a user's handprint (e.g., fingerprints).

A shock wave generated by the impact applied to the surface of the window substrate 110 may be transmitted to the glass substrate 112 through the coating layer. In addition, the shock wave may be transmitted from the glass substrate 112 to the bonding layer 114 through the stress relief layer 116. The shock wave transmitted to the bonding layer 114 may be dissipated to the outside or may be relieved in the bonding layer 114.

In an exemplary embodiment, a protective film 150 may be attached to another surface of the display panel 120 through the second adhesive layer 140, as illustrated in FIGS. 7 and 8, as a lower structure.

FIG. 7 is a perspective view illustrating an exemplary embodiment of a lower structure of a display panel including a window substrate, and FIG. 8 is a cross-sectional view illustrating a bottom structure of the display panel including the window substrate illustrated in FIG. 7.

Referring to FIGS. 7 and 8, an exemplary embodiment of the lower structure of the display panel 120 on which the window substrate 110 is disposed may include a second adhesive layer 140 and a protective film 150.

The protective film 150 may be disposed on another surface of the display panel 120. The window substrate 110 may be attached to the display panel 120 through the first adhesive layer 130.

The second adhesive layer 140 may be disposed between the display panel 120 and the protective film 150, and attach one surface of the protective film 150 to another surface of the display panel 120.

Since the window substrate 110, the first adhesive layer 130, the second adhesive layer 140 and the protective film 150 as well as the display panel 120 are all used in the flexible display device 100, each of them has flexible properties.

The second adhesive layer 140 may be formed, for example, by applying and curing a composition for forming an adhesive layer on one surface of the protective film 150. The kind of the composition for forming an adhesive layer is not particularly limited within the scope of the invention.

In an exemplary embodiment, a pressure-sensitive adhesive or a composition for forming an adhesive layer that satisfies the elastic modulus range of the adhesive layer 130 may be used, for example. Specifically, the second adhesive layer 140 may be a coating layer that includes an adhesive layer-forming composition based on (meth) acryl, silicone, rubber, urethane, polyester or epoxy-copolymer, or a coating layer including an optically clear adhesive ("OCA"), and preferably, a coating layer that includes an adhesive layer-forming composition including acrylic copolymer.

In an exemplary embodiment, the protective film 150 may include at least one of polyimide ("PI"), polyamideimide ("PAI"), polyetheretherketone ("PEEK"), and polyetherimide ("PEI"), for example.

Figure 9:
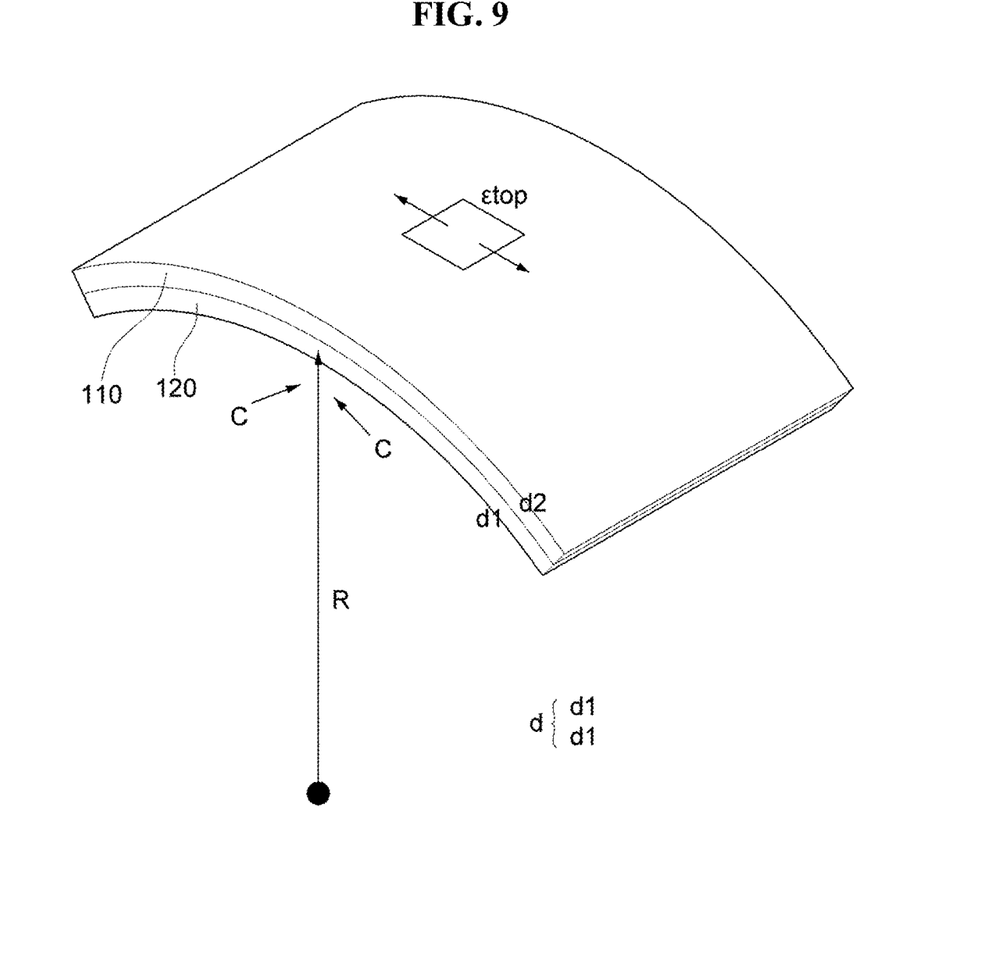
FIG. 9 is a view showing an exemplary embodiment of a folding stress according to the thickness and folding radius of a flexible display device.

FIG. 9 is a view showing an exemplary embodiment of a folding stress according to the thickness and folding radius of a flexible display device.

Referring to FIG. 9, with respect to an exemplary embodiment of the flexible display device 100, a folding stress $\varepsilon_{top}$ may be calculated as in the following Equation 1 based on a thickness d1 of the display panel 120, a thickness d2 of the window substrate 110, and a folding radius R of the window substrate 110.

$$\varepsilon_{top} = \left(\frac{d_1 + d_2}{2R}\right)\kappa \qquad \text{[Equation 1]}$$

In Equation 1, the folding stress $\varepsilon_{top}$ denotes a tensile force generated when the window substrate 110 and the display panel 120 are bent. In Equation 1, "d1" denotes the thickness of the display panel 120, "d2" denotes the thickness of the window substrate 110, and "R" denotes the folding radius. In FIG. 9, "C" represents a compressive strength according to the tensile force.

It may be appreciated from Equation 1 that the folding stress $\varepsilon_{top}$ is proportional to the thickness d1 of the display panel 120 and the thickness d2 of the window substrate 110, and is inversely proportional to the folding radius R. A constant "k" may be calculated by the following equation 2.

$$\kappa = \frac{(1 + 2\eta + \chi\eta^2)}{(1 + \eta)(1 + \chi\eta)} \qquad \text{[Equation 2]}$$

$$\eta = \frac{d_2}{d_1}, \chi = \frac{Y_2}{Y_1}$$

In Equation 2, "$Y_1$" denotes the modulus of the display panel 120, and "$Y_2$" represents the modulus of the window substrate 110. Accordingly, "η" may be obtained by dividing the thickness d2 of the window substrate 110 by the thickness d1 of the display panel 120, and "x" may be obtained by dividing the elastic modulus $Y_2$ of the window substrate 110 by the elastic modulus $Y_1$ of the display panel 120.

Typical flexible display device have a structure including a glass substrate (30~50 μm), a PSA1 (50 μm), a film (25 μm), a PSA2 (22 μm), a polarizer (35 μm), a PSA3 (50 μm), a panel (37 μm) and a lower protective film (300~400 μm). Accordingly, the thickness of the entire panel is large and the folding radius R is reduced, such that the strain becomes large. That is, although the thickness d1 of the display panel 120 and the thickness d2 of the window substrate 110 are substantially the same in Equation 1, in a case where the folding radius R decreases, the strain increases and thus the folding stress increases.

Figure 10:
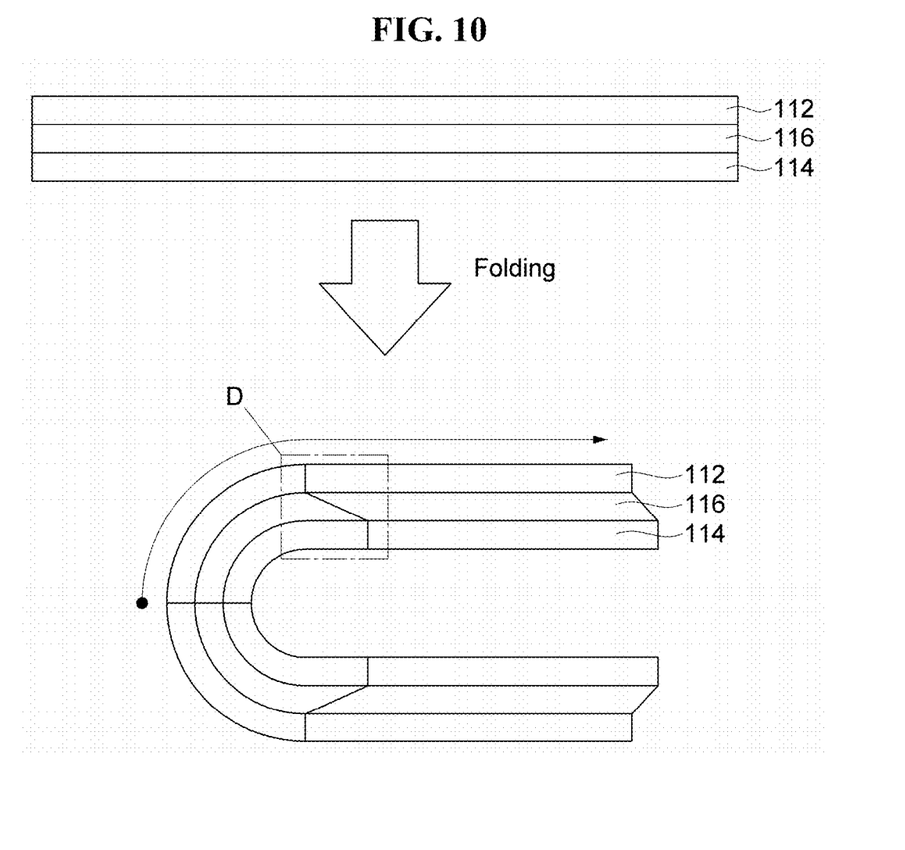
FIG. 10 is a view illustrating an exemplary embodiment of stress relief when folding a window substrate.

An exemplary embodiment of the flexible display device 100 may reduce an overall thickness d so as to reduce strain. In an exemplary embodiment, under the condition that the folding radii R of the window substrate 110 and the display panel 120 are substantially the same, the flexible display 100 may reduce the overall thickness d by forming the window substrate 110 with the glass substrate 112, the stress relief layer 116, and the bonding layer 114, as illustrated in FIG. 10, for example. In such an exemplary embodiment, the flexible display device 100 may be configured such that a polarizer or the like is unitary with the display panel 120.

The flexible display device 100 may greatly reduce the overall thickness by forming the window substrate 110 with the glass substrate 112 having a thickness of about 30 μm, the stress relief layer 116 having a thickness in a range from about 25 μm to about 50 μm, and the bonding layer 114 having a thickness in a range from about 30 μm to about 50 μm.

FIG. 10 is a view illustrating an exemplary embodiment of stress relief when folding a window substrate.

When an upper structure of the display panel 120 is thin, panel damages (e.g., bright or dark spot fault on a display) may easily occur due to an external impact such as a pen drop.

Referring to FIG. 10, a thickness of the window substrate 110 (e.g., refer to FIG. 1) may increase by attaching the bonding layer 114 to the glass substrate 112 through the stress relief layer 116. Accordingly, the flexible display device 100 (e.g., refer to FIG. 5) may substantially prevent panel damages of the display panel 120 (e.g., refer to FIG. 5) against an external impact through the thickened window substrate 110.

In addition, although the thickness of the glass substrate 112 decreases, even when the thickness of the window substrate 110 is substantially equal to or greater than a conventional thickness thereof, the stress relief layer 116 relieves the folding stress, and thus an increase in overall strain due to the thickness increase may be substantially prevented.

The window substrate 110 may reduce the folding stress or strain by decoupling D of the stress relief layer 116 at the time of folding, as illustrated in FIG. 10.

In addition, a bending stiffness of the window substrate 110 may be reduced by the stress relief layer 116 at the time of bending.

In addition, the window substrate 110 may reduce the panel damages by the thickness of the glass substrate 112, the stress relief layer 116 and the bonding layer 114, and the impact dispersion of the stress relief layer 116.

Figure 11:
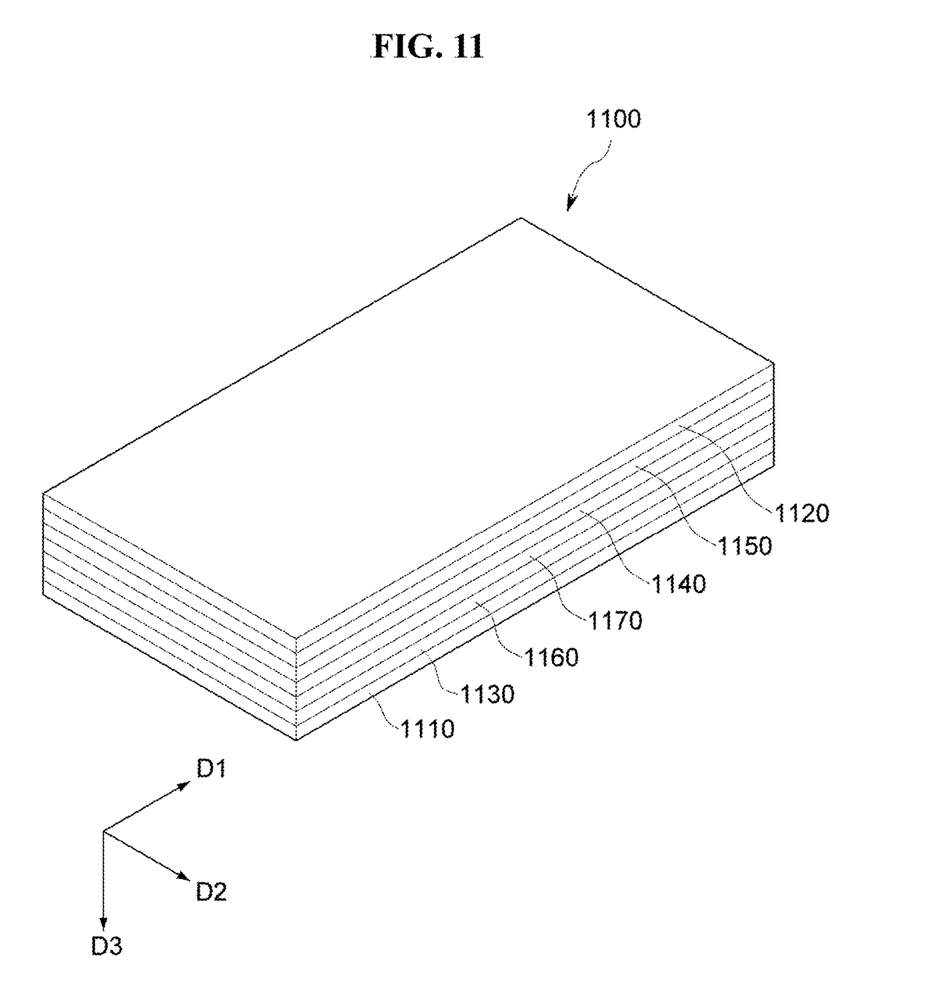
FIG. 11 is an explanatory perspective view illustrating another exemplary embodiment of a flexible display device.

FIG. 11 is an explanatory perspective view illustrating another exemplary embodiment of a flexible display device.

Referring to FIG. 11, another exemplary embodiment of a flexible display device 1100 may include a display panel 1110, a glass substrate 1120, an adhesive layer 1130, a first bonding layer 1140, a first stress relief layer 1150, a second bonding layer 1160, and a second stress relief layer 1170.

The display panel 1110 may include a wire grid polarizer. That is, the display panel 1110 includes a polarizing plate that is thin and has excellent in flatness, and the polarizing plate is not illustrated in the drawing. The polarizing plate includes a base substrate and a linear polarizer disposed on the base substrate. The base substrate may include a material having, for example, excellent transparency, heat resistance, and chemical resistance. In an exemplary embodiment, the base substrate may include a plastic substrate including at least one of polyamide, polyimide, polyethylene naphthalate, polyethylene terephthalate and polyacryl, for example.

The linear polarizer includes a plurality of line patterns disposed parallelly on the base substrate. The line patterns each have a straight line shape extending in one direction, each have a predetermined width, and are spaced apart from one another at a predetermined distance. The line pattern may include a metal. The linear polarizer including the plurality of linear metal patterns may be referred to as a wire grid polarizer ("WGP"). An exemplary embodiment of the linear polarizer is a WGP. The line pattern may include at least one of aluminum (Al), gold (Au), silver (Ag), copper (Cu), chromium (Cr), iron (Fe), and/or nickel (Ni).

The linear polarizer may be provided by methods such as an imprinting method using a mold or a photolithography method, but the invention is not limited thereto. The linear polarizer may be provided using a block copolymer.

Since including the line patterns that are significantly thin and uniform, the linear polarizer may obtain excellent polarization efficiency when disposed on the base substrate having excellent flatness.

The polarizing plate including the WGP may be disposed on the display panel 1110. Although not illustrated, the polarizing plate converts an optical axis of light emitted to the outside through the display panel 1110 and a touch panel. In general, the polarizing plate has a structure in which a transparent protective film is laminated on opposite surfaces or one surface of a linear polarizer including a polyvinyl alcohol-based resin.

The polarizing plate has a structure in which a triacetyl cellulose ("TAC") film is attached as a protective film to a linear polarizer that includes a PVA-based molecular chain structure oriented in a predetermined direction and includes an iodine compound or a dichroic polarizing material. In such an exemplary embodiment, the linear polarizer and the protective film may be attached to each other by a water-based adhesive including a PVA-based aqueous solution. However, the polarizer may have any suitable structures known in the art rather than the above described structure.

The glass substrate 1120 may be disposed on one surface of the display panel 1110.

The adhesive layer 1130 may be disposed between the display panel 1110 and the glass substrate 1120 and may attach one surface of the display panel 1110 to one surface of the glass substrate 1120.

The first bonding layer 1140 may be disposed between the glass substrate 1120 and the adhesive layer 1130.

The first stress relief layer 1150 is disposed between the first bonding layer 1140 and the glass substrate 1120, and the first bonding layer 1140 may have a thickness larger than that of the glass substrate 1120.

The second bonding layer 1160 may be disposed between the first bonding layer 1140 and the adhesive layer 1130.

The second stress relief layer 1170 may be disposed between the second bonding layer 1160 and the first bonding layer 1140.

In such an exemplary embodiment, the glass substrate 1120, the first bonding layer 1140, the first stress relief layer 1150, the second bonding layer 1160, and the second stress relief layer 1170 may constitute the window substrate 110. Accordingly, the adhesive layer 1130 is disposed between the display panel 1110 and the window substrate 110 to attach the display panel 1110 and the window substrate 110 to each other.

The second bonding layer 1160 may have a thickness greater than a thickness of the glass substrate 1120. In an exemplary embodiment, when the thickness of the glass substrate 1120 is about 30 μm, the second bonding layer 1160 may have a thickness larger than 30 μm, for example.

Figure 12:
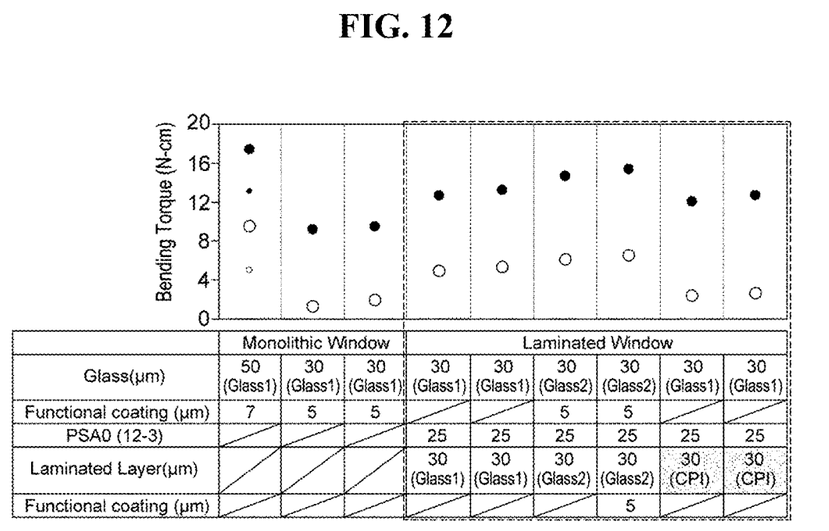
FIG. 12 is a graph showing an exemplary embodiment of a bending torque at the time of bending a window substrate including a bonding layer.

An exemplary embodiment of the flexible display device 1100 has a bending torque that is reduced due to the window substrate that includes the first bonding layer 1140 and the second bonding layer 1160 at the time of folding, as illustrated in FIG. 12. FIG. 12 is a graph showing an exemplary embodiment of a bending torque at the time of bending the window substrate including the bonding layer. That is, FIG. 12 is a graph showing a result of measuring the torque by the Clam shell method. It may be appreciated that the bending stiffness is reduced due to the stress relief effect of the first stress relief layer 1150 and the second stress relief layer 1170 in an exemplary embodiment of the flexible display device 1100.

The second stress relief layer 1170 may include a pressure sensitive adhesive that is foldable. Accordingly, the second stress relief layer 1170 may be disposed between the bonding layer 1140 and the second bonding layer 1160 to attach the first bonding layer 1140 and the second bonding layer 1160 to each other. In such an exemplary embodiment, the second stress relief layer 1170 may include a material different from a material included in the adhesive layer 1130.

The second stress relief layer 1170 may have a thickness greater than a thickness of the adhesive layer 1130. In an exemplary embodiment, when the thickness of the adhesive layer 1130 is about 25 μm, the second stress relief layer 1170 may have a thickness greater than 25 μm, for example. In such an exemplary embodiment, the thickness of the second stress relief layer 1170 may be in a range from about 30 μm to about 50 μm, for example.

The second stress relief layer 1170 may include a material based on at least one of acryl, silicone, epoxy, and urethane.

Figure 13:
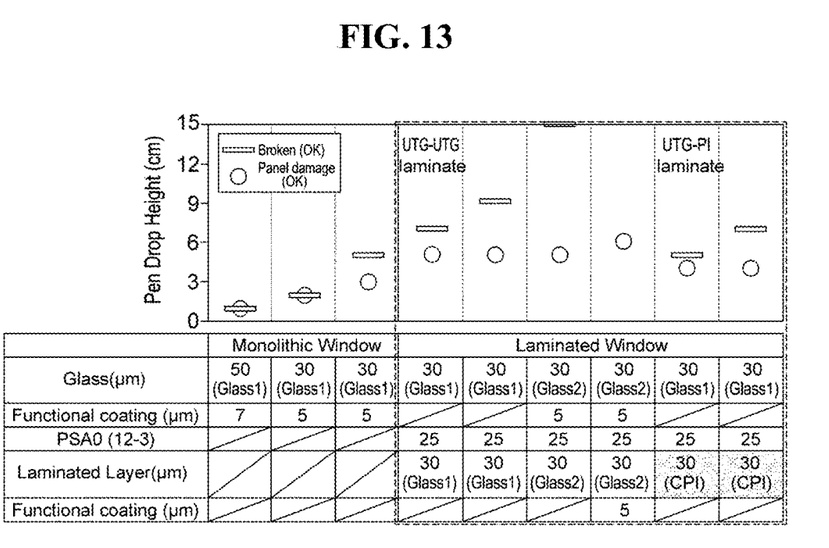
FIG. 13 is a graph showing an exemplary embodiment of an impact resistance characteristic of the flexible display device.

In an exemplary embodiment, a modulus of the second stress relief layer 1170 may be equal to or greater than about 800 MPa. An exemplary embodiment of the flexible display device 1100 may set the modulus of the foldable bonding layer to be substantially equal to or higher than about 0.8 GPa as illustrated in the following Table 1.

drop by including the first bonding layer 1140, the first stress relief layer 1150, the second bonding layer 1160, and the second stress relief layer 1170, as illustrated in FIG. 13. FIG. 13 is a graph showing an impact resistance characteristic of an exemplary embodiment of the flexible display device. As illustrated in FIG. 13, an exemplary embodiment of the flexible display device 1100 that includes a laminated window including the first bonding layer 1140 and the first stress relief layer 1150 may reduce damage to the display panel 1110 than a monolithic window that includes only a glass substrate 1120, as a point where panel damage occurs increases as a pen drop height increases.

Figure 14:
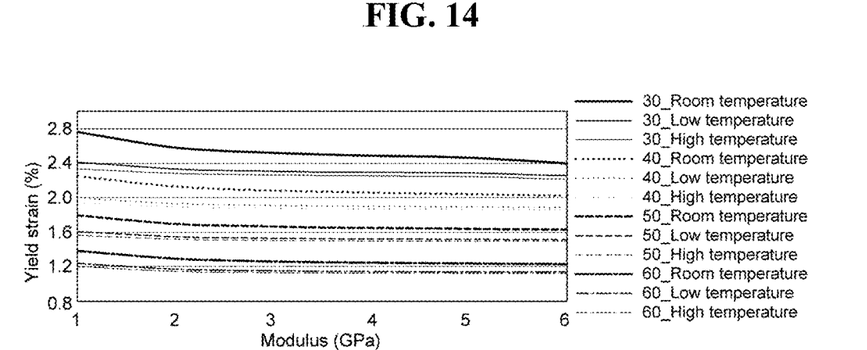
FIG. 14 is a graph showing an exemplary embodiment of a strain applied to the bonding layer.

In an exemplary embodiment, a yield strain of the second stress relief layer 1170 may be equal to or greater than about 1.0%. That is, the yield strain of an exemplary embodiment of the flexible display device 1100 is equal to or greater than about 1.0% as illustrated in FIG. 14 in consideration of the conditions such as the thickness of the bonding layer, modulus, temperature (high temperature, room temperature, and low temperature). FIG. 14 is a graph showing an exemplary embodiment of a strain applied to the bonding layer. In this case, in consideration of general material characteristics, the thickness of the bonding layer is in a range from about 30 μm to about 50 μm.

As such, a window substrate capable of reducing a folding stress while thinning a thickness of a window glass of a display unit, and to a flexible display device including the window substrate may be implemented.

As set forth hereinabove, in one or more embodiments of the invention, an exemplary embodiment of the flexible display device may reduce the bending torque at the time of folding due to a window substrate including a bonding layer and reduce the bending stiffness by relieving the stress by a stress relief layer.

In addition, as the thickness of the window substrate increases by adding the bonding layer and the stress relief

TABLE 1

| | | Bonding layer (modulus) | | | | | | | |
|---|---|---|---|---|---|---|---|---|---|
| | | 0.6 GPa | | | 0.7 GPa | | | 0.8 GPa | |
| Classification | Buckling | In (ε, %) | Out (ε, %) | Buckling | In (ε, %) | Out (ε, %) | Buckling | In (ε, %) | Out (ε, %) |
| Glass | None None In 2 Out 3 | -1.49 1.01 | 0.97 -0.48 | None None In 4 Out 0 | -1.48 1.01 | 0.96 -0.48 | None None | -1.49 1.01 | 0.97 -0.48 |
| Bonding layer | | -0.92 2.28 | 1.95 -0.13 | | -1.00 2.20 | 1.84 -0.24 | | -1.09 2.11 | 1.82 -0.26 |
| Panel | | -0.52 0.08 | 0.37 -0.05 | | -0.42 0.02 | 0.30 -0.01 | | -0.52 0.08 | 0.37 -0.05 |

In the case where the elastic modulus of one of the first bonding layer 1140, the first stress relief layer 1150, the second bonding layer 1160 and the second stress relief layer 1170 is set to be less than about 800 MPa, buckling failure may occur.

The second stress relief layer 1170 may include a material of which modulus increases by application of an external force. In such an exemplary embodiment, the modulus of the bonding layer 114 may increase by an external force to a range from about 800 MPa to about 1 GPa.

It may be appreciated that an exemplary embodiment of the flexible display device 1100 is improved in an impact resistance characteristic to withstand an impact such as a pen layer to the glass substrate, it is possible to substantially prevent the display panel from being damaged even by an impact such as a pen drop.

While the invention has been illustrated and described with reference to the exemplary embodiments thereof, it will be apparent to those of ordinary skill in the art that various changes in form and detail may be made thereto without departing from the spirit and scope of the invention.

What is claimed is:

1. A window substrate comprising:
   a glass substrate;
   a first bonding layer disposed on a first surface of the glass substrate; and a first stress relief layer disposed between the bonding layer and the glass substrate, wherein the first bonding layer has a thickness greater than a thickness of the glass substrate, wherein the first stress relief layer comprises a pressure sensitive adhesive which is foldable.

2. The window substrate of claim 1, wherein the first stress relief layer comprises a material different from a material comprised in the first bonding layer.

3. The window substrate of claim 1, wherein the first stress relief layer has a thickness greater than a thickness of the glass substrate.

4. The window substrate of claim 1, wherein the first stress relief layer comprises a material based on at least one of acrylic, silicon, epoxy and urethane.

5. The window substrate of claim 1, wherein a modulus of the first stress relief layer is equal to or greater than about 800 megapascals.

6. The window substrate of claim 1, wherein a yield strain of the first stress relief layer is equal to or greater than about 1.0 percent.

7. The window substrate of claim 1, wherein a thickness of the first stress relief layer is in a range from about 30 micrometers to about 50 micrometers.

8. The window substrate of claim 1, wherein a thickness of the glass substrate is in a range from about 10 micrometers to about 30 micrometers.

9. The window substrate of claim 1, wherein the first stress relief layer comprises a material of which modulus increases by application of an external force.

10. The window substrate of claim 9, wherein the modulus of the first stress relief layer is increased by the external force to a range equal to or greater than about 800 megapascals and equal to or less than about 1 gigapascal.

11. A window substrate comprising:
a glass substrate;
a first bonding layer disposed on a first surface of the glass substrate; and
a first stress relief layer disposed between the bonding layer and the glass substrate,
wherein each of the first stress relief layer and the first bonding layer has a thickness greater than a thickness of the glass substrate.

12. A substrate comprising:
a glass substrate;
a first bonding layer disposed on a first surface of the glass substrate;
a first stress relief layer disposed between the bonding layer and the glass substrate,
a second bonding layer disposed on a second surface of the first bonding layer; and
a second stress relief layer disposed between the second bonding layer and the first bonding layer,
wherein the first bonding layer has a thickness greater than a thickness of the glass substrate.

* * * * *